US008541755B1

(12) United States Patent
Sawada

(10) Patent No.: US 8,541,755 B1
(45) Date of Patent: Sep. 24, 2013

(54) ELECTRON MICROSCOPE

(75) Inventor: Hidetaka Sawada, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 13/467,318

(22) Filed: May 9, 2012

(51) Int. Cl.
*H01J 29/56* (2006.01)
*H01J 37/145* (2006.01)

(52) U.S. Cl.
CPC ....... *H01J 29/566* (2013.01); *H01J 2229/5632* (2013.01); *H01J 27/145* (2013.01)
USPC .................................................. 250/396 R

(58) Field of Classification Search
CPC H01J 29/566; H01J 2229/5632; H01J 37/145
USPC .................................................. 250/396 R
See application file for complete search history.

(56) References Cited

U.S. PATENT DOCUMENTS

| | | | |
|---|---|---|---|
| 2,401,315 A * | 6/1946 | Ramberg | 250/311 |
| 6,329,659 B1 * | 12/2001 | Krijn et al. | 250/396 R |
| 6,440,620 B1 * | 8/2002 | Katsap et al. | 430/30 |
| 7,723,683 B2 | 5/2010 | Sawada | |
| 2008/0093563 A1 * | 4/2008 | Sawada et al. | 250/396 R |
| 2008/0283749 A1 * | 11/2008 | Muller et al. | 250/311 |
| 2010/0084567 A1 * | 4/2010 | Sawada et al. | 250/396 ML |

FOREIGN PATENT DOCUMENTS

| | | | |
|---|---|---|---|
| JP | 2008123999 A | | 5/2008 |
| JP | 200954565 A | | 3/2009 |
| JP | 2013030374 A | * | 2/2013 |

OTHER PUBLICATIONS

Sawada et al., "Development of Cs and Cc Correctors for 30kV-electron Microscope", ALC'11 Proceedings, 23JS03, May 22-27, 2011, Seoul, Korea, p. 18-21.*
Hosokawa et al., "Development of Cs and Cc correctors for transmission electron microscopy", Microscopy (Tokyo), 62(1): 23-41 (2013).*
Sasaki et al., "Performance and Application of Chromatic/Spherical Aberration-Corrected 30 kV Transmission Electron Microscope", Microsc. Microanal. 17 (Suppl 2), 2011.*
H. Rose, "Historical aspects of aberration correction", Journal of Electron Microscopy, (2009), pp. 77-85, 58(3).
H. Sawada et al, "8th International Symposium on Atomic Level Characterizations for New Materials and Devices '11", held on May 22-27, 2011, pp. 17-21, Seoul, Korea.
Proceedings of the Sixty-seventh Annual Meeting of the Japanese Society of Microscopy, held on May 16-18, 2011, 3 pages, vol. 46, Supplement 1.

* cited by examiner

*Primary Examiner* — Robert Kim
*Assistant Examiner* — James Choi
(74) *Attorney, Agent, or Firm* — The Webb Law Firm

(57) ABSTRACT

An electron microscope is offered which can correct chromatic and spherical aberrations without producing residual aberrations. In this microscope, a chromatic aberration-correcting optical system and a spherical aberration-correcting optical system are connected in series (in tandem) via a connection system. That is, the chromatic aberration-correcting optical system and the spherical aberration-correcting optical system are configured independently. Chromatic and spherical aberrations are corrected separately.

1 Claim, 3 Drawing Sheets

ELECTRON MICROSCOPE

BACKGROUND OF THE INVENTION

1. Field of the Invention

The present invention relates to an electron microscope and, more particularly, to an electron microscope capable of correcting chromatic aberration and spherical aberration.

2. Description of Related Art

If chromatic aberration (Cc) and spherical aberration (Cs) can be corrected, high-resolution electron microscope imaging is enabled. H. Rose, J. Electron Microsc. 58, 77 (2009), described below, sets forth an aberration-correcting optical system capable of correcting chromatic aberration and spherical aberration at the same time.

However, in an optical system where a chromatic aberration correction and a spherical aberration correction are made at the same time, different properties of aberrations (chromatic and spherical aberrations) are corrected at the same time. Therefore, the electron beam orbit is varied, which is undesirable to one type of aberration correction. Consequently, residual aberrations such as chromatic aberration and star aberrations are produced. This makes it impossible to achieve high-resolution electron microscope imaging.

SUMMARY OF THE INVENTION

In view of the foregoing problem, the present invention has been made. It is an object of the invention to provide an electron microscope capable of correcting chromatic aberration and spherical aberration without producing residual aberrations.

An electron microscope which achieves the above-described object has a chromatic aberration-correcting optical system and a spherical aberration-correcting optical system that is configured independent of the chromatic aberration-correcting optical system but connected in series with the chromatic aberration-correcting optical system.

According to the present invention, an electron microscope is offered which can correct chromatic and spherical aberrations without producing residual aberrations.

DESCRIPTION OF THE PREFERRED EMBODIMENTS

The preferred embodiment of the present invention is hereinafter described with reference to the drawings.

Figure 1:
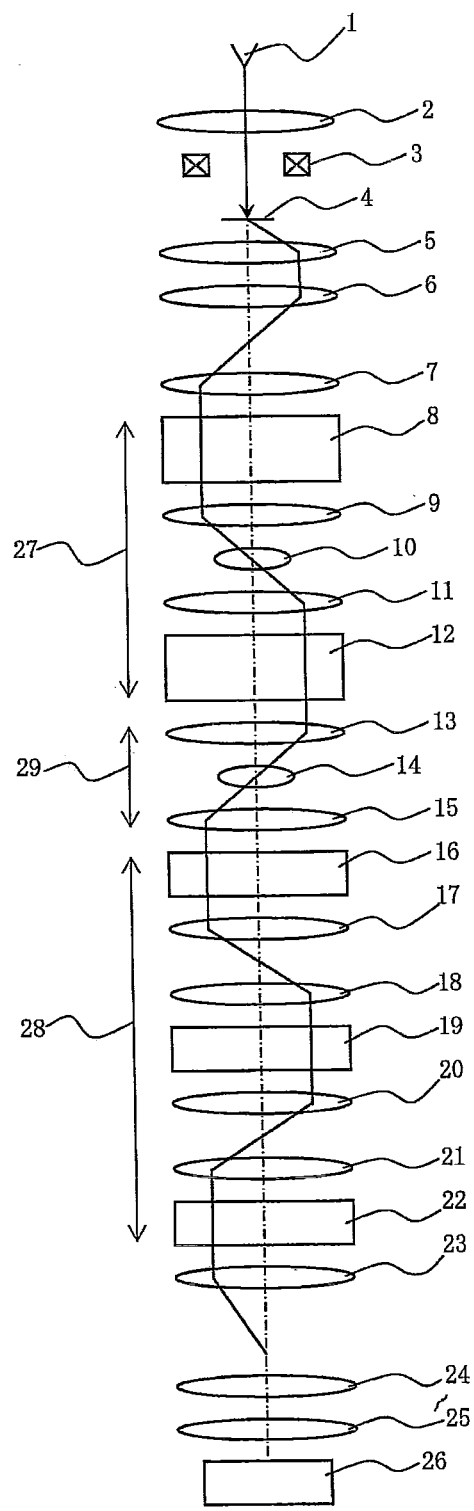
FIG. 1 is a ray diagram of one electron microscope according to the present invention.

FIG. 1 shows one example of an electron microscope of the present invention.

In FIG. 1, the microscope has an electron gun 1. Arranged in turn behind the electron gun 1 are a condenser lens 2, a deflecting lens 3, a sample 4, an objective lens 5, an objective minilens (transfer lens) 6, another objective minilens (transfer lens) 7, a quadrupole field-generating multipole element 8, a transfer lens 9, a rotation-correcting lens 10, a transfer lens 11, a quadrupole field-generating multipole element 12, a transfer lens 13, a rotation-correcting lens 14, a transfer lens 15, a front-stage multipole element 16, a transfer lens 17, a transfer lens 18, a middle-stage multipole element 19, a transfer lens 20, a transfer lens 21, a rear-stage multipole element 22, a post collector lens 23, an intermediate lens 24, a projector lens 25, and an imaging device 26.

The quadrupole field-generating quadrupole element 8, transfer lens 9, rotation-correcting lens 10, transfer lens 11, and quadrupole field-generating element 12 together constitute a chromatic aberration-correcting optical system 27. Chromatic aberration in the whole system of the spectrometer of FIG. 1 is corrected by the chromatic aberration-correcting optical system 27, which is made of the chromatic aberration corrector set forth in JP-A-2008-123999 (U.S. Publication No. 2008-0093563). The rotation-correcting lens 10 of the chromatic aberration-correcting optical system 27 corrects the rotational relationship between the quadrupole field produced by the quadrupole field-generating multipole element 8 and the quadrupole field produced by the quadrupole field-generating multipole element 12.

Furthermore, the front-stage multipole element 16, transfer lens 17, transfer lens 18, middle-stage multipole element 19, transfer lens 20, transfer lens 21, and rear-stage multipole element 22 together constitute a spherical aberration-correcting optical system 28. Spherical aberration in the whole system of the instrument of FIG. 1 is corrected by the spherical aberration-correcting optical system 28. The spherical aberration corrector set forth in JP-A-2009-54565 (U.S. Pat. No. 7,723,683) is used as the spherical aberration-correcting optical system 28.

In addition, the transfer lens 13, rotation-correcting lens 14, and the transfer lens 15 together constitute a connection system 29. This connection system 29 including the transfer lenses optically couples the chromatic aberration-correcting optical system 27 and the spherical aberration-correcting optical system 28. The transfer lenses 13 and 15 of the connection system 29 operate to transfer an image equivalent to the image obtained by the quadrupole field-generating multipole element 12 to the front-stage multipole element 16 of the spherical aberration-correcting optical system 28. The rotation-correcting lens 14 of the connection system 29 operates similarly to the rotation-correcting lens 10, and acts to correct the rotational relationship between the quadrupole field generated by the quadrupole field-generating multipole element 12 and the three-fold symmetric field produced by the front-stage multipole element 16.

In this way, in the electron microscope of FIG. 1, the chromatic aberration-correcting optical system 27 and spherical aberration-correcting optical system 28 are connected in series (in tandem) via the connection system 29. That is, the optical systems 27 and 28 are configured independent of each other. Chromatic aberration and spherical aberration are corrected separately. This is a feature of the present invention and different from the technique of the afore-cited H. Rose, J. Electron Microsc. 58, 77 (2009).

The instrumental configuration of FIG. 1 has been described so far. The operation of the instrument of FIG. 1 is described below.

An electron beam emitted from the electron gun 1 hits the sample 4. The beam transmitted through the sample 4 undergoes lens actions from the objective lens 5, objective minilenses 6, 7 and hits the chromatic aberration-correcting optical system 27. Chromatic aberration in the electron beam is corrected by the quadrupole fields produced respectively by the quadrupole field-generating multipole elements 8 and 12 of the chromatic aberration-correcting optical system 27. This correction system 27 is a Cc corrector utilizing a concave lens effect produced by thick quadrupole fields as described in the afore-cited JP-A-2008-123999.

The electron beam emitted from the chromatic aberration-correcting optical system 27 is transferred to the spherical aberration-correcting optical system 28 by the transfer lenses 13 and 15 of the connection system 29. Spherical aberration in the electron beam is corrected by the three-fold symmetric fields produced by the multipole elements 16, 19, and 22, respectively. That is, as described in the afore-cited JP-A-2009-54565, the three-fold symmetric fields produced by the multipole elements 19 and 22 are rotated through a given angle relative to the three-fold symmetric field produced by the multipole element 16, thus correcting the spherical aberration.

The electron beam emitted from the spherical aberration-correcting optical system 28 undergoes lens actions of the post collector lens 23, intermediate lens 24, and projector lens 25, and a magnified sample image (TEM image) is taken by the imaging device 26.

The operation of the instrument of FIG. 1 has been described so far. As described above, in this instrument, chromatic aberration is independently corrected by the chromatic aberration-correcting optical system 27. Furthermore, spherical aberration is independently corrected by the spherical aberration-correcting optical system 28. Therefore, in the instrument of FIG. 1, the prior art problem, i.e., the electron beam orbit is varied in a manner undesirable to correction of one type of aberration, does not occur. Hence, any residual aberrations such as chromatic aberration and star aberrations caused by interference of the chromatic and spherical aberration-correcting optical systems with the optical beam orbit do not take place. As a result, the TEM image taken by the imaging device 26 is affected by none of chromatic aberration, spherical aberration, and residual aberrations. Thus, high-resolution TEM imaging is achieved.

Figure 2:
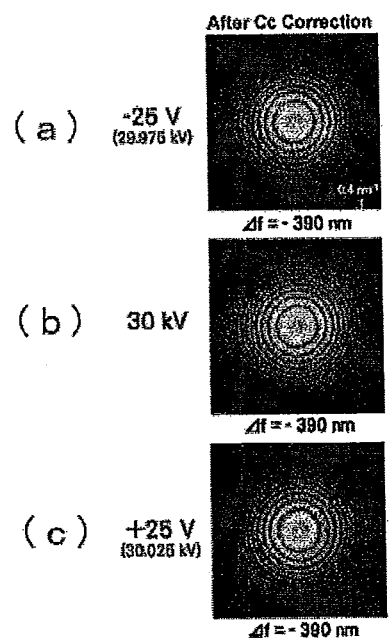
FIG. 2 shows experimental data obtained using the microscope of FIG. 1.
Figure 3:
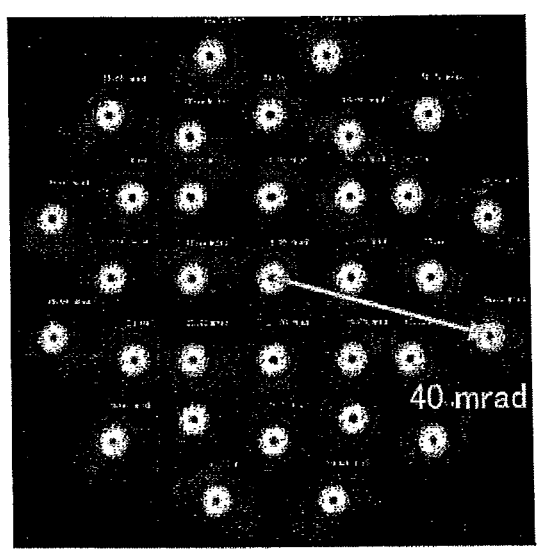
FIG. 3 shows other experimental data obtained using the microscope of FIG. 1.

FIGS. 2 and 3 show experimental data obtained using the instrument of FIG. 1 under the condition where the chromatic aberration-correcting optical system 27 and spherical aberration-correcting optical system 28 were in operation. FIG. 2 is prepared to demonstrate that chromatic aberration has been corrected in the instrument of FIG. 1. On the other hand, FIG. 3 is prepared to show that spherical aberration has been corrected and residual aberrations (such as chromatic aberration and star aberrations) are not produced in the instrument of FIG. 1.

Referring particularly to FIG. 2, images (a)-(c) are diffractograms, which have been obtained by taking TEM images of the sample (amorphous thin film) 4 by the imaging device 26 and Fourier-transforming the TEM images. The diffractogram (a) has been obtained from a TEM image taken under the condition where the accelerating voltage was set to 29.975 kV. The diffractogram (b) has been obtained from a TEM image taken under the condition where the accelerating voltage was set to 30 kV. The diffractogram (c) has been obtained from a TEM image taken under the condition where the accelerating voltage was set to 30.025 kV. It is shown that the diffractogram does not vary in shape and the focus is kept constant if the accelerating voltage is varied. This demonstrates that chromatic aberration has been corrected by the chromatic aberration-correcting optical system 27.

FIG. 3 shows a diffractogram tableau, which is an array of diffractograms obtained by making an electron beam hit the amorphous thin film (sample 4) at different angles. As can be seen from FIG. 3, if the electron beam is tilted, all of 33 diffractograms are truly round circles. This demonstrates that spherical aberration has been corrected by the spherical aberration-correcting optical system 28 and that any residual aberrations such as chromatic aberration and star aberrations are not produced. When spherical aberration is not corrected or residual aberrations are produced, if the electron beam is tilted, the diffractograms shown in FIG. 3 will not be true circles.

While one example of the present invention has been described so far with reference to FIGS. 1-3, the invention is not restricted thereto. For example, the chromatic aberration-correcting optical system 27 and spherical aberration-correcting optical system 28 of the instrument shown in FIG. 1 may be interchanged in position.

Furthermore, in the above embodiment, the chromatic aberration-correcting optical system 27 and spherical aberration-correcting optical system 28 are arranged in the imaging system located behind the sample. They may also be positioned in the illumination system located above the sample. In this case, the chromatic aberration-correcting optical system 27 and spherical aberration-correcting optical system 28 may be similarly positionally interchanged, and the spherical aberration-correcting optical system 28 may be disposed on the electron gun side.

Having thus described my invention with the detail and particularity required by the Patent Laws, what is desired protected by Letters Patent is set forth in the following claims.

The invention claimed is:
1. An electron microscope comprising:
an independent chromatic aberration-correcting optical system;
an independent spherical aberration-correcting optical system configured independent of the chromatic aberration-correcting optical system and connected in series with the chromatic aberration-correcting optical system; and
transfer lenses arranged between the independent chromatic aberration-correcting optical system and the independent spherical aberration-correcting optical system.

* * * * *